United States Patent
Vasa et al.

(10) Patent No.: US 11,683,887 B2
(45) Date of Patent: Jun. 20, 2023

(54) ADD-IN CARD CONNECTOR EDGE FINGER OPTIMIZATION FOR HIGH-SPEED SIGNALING

(71) Applicant: Dell Products L.P., Round Rock, TX (US)

(72) Inventors: Malikarjun Vasa, Secunderabad (IN); Sanjay Kumar, Ranchi (IN); Bhyrav Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/506,045

(22) Filed: Oct. 20, 2021

(65) Prior Publication Data

US 2023/0025833 A1    Jan. 26, 2023

(30) Foreign Application Priority Data

Jul. 26, 2021 (IN) .............................. 202111033527

(51) Int. Cl.
*H05K 1/18* (2006.01)
*H05K 1/02* (2006.01)

(52) U.S. Cl.
CPC ........... *H05K 1/182* (2013.01); *H05K 1/0218* (2013.01); *H05K 1/0237* (2013.01); *H05K 2201/0183* (2013.01); *H05K 2201/10621* (2013.01)

(58) Field of Classification Search
CPC .... H05K 1/182; H05K 1/0218; H05K 1/0237; H05K 2201/0183; H05K 2201/10621
See application file for complete search history.

(56) References Cited

U.S. PATENT DOCUMENTS

| | | | |
|---|---|---|---|
| 7,980,896 B1* | 7/2011 | Morgan | H01R 13/6461 439/607.05 |
| 9,986,634 B2 | 5/2018 | Rose et al. | |
| 10,176,143 B2 | 1/2019 | Tamarkin et al. | |
| 2004/0016569 A1* | 1/2004 | Mix | H05K 1/117 174/261 |
| 2004/0235326 A1* | 11/2004 | Reisinger | H05K 1/117 439/181 |
| 2007/0128891 A1* | 6/2007 | Ling | H05K 1/117 439/55 |
| 2007/0152768 A1* | 7/2007 | Mellitz | H01R 13/6471 333/1 |
| 2008/0099238 A1* | 5/2008 | Djordjevic | H05K 1/0237 174/262 |
| 2008/0261433 A1* | 10/2008 | Pipho | H01R 13/641 439/326 |

(Continued)

*Primary Examiner* — Hoa C Nguyen
(74) *Attorney, Agent, or Firm* — Larson Newman, LLP

(57) ABSTRACT

An add-in card printed circuit board (PCB) includes a body portion and a card edge portion. The body portion includes a circuit trace associated with a high-speed data communication interface. The card edge portion includes contact fingers, and is configured to be inserted into a card edge connector of an information handling system. The contact fingers include a signal contact finger coupled to the circuit trace, and a ground contact finger that is located adjacent to the signal contact finger. The ground contact finger includes a ground via that couples the ground contact finger to a ground plane layer of the add-in card PCB. The ground via is located half way within the body portion and half way within the card edge portion.

20 Claims, 4 Drawing Sheets

(56) References Cited

U.S. PATENT DOCUMENTS

| | | | | |
|---|---|---|---|---|
| 2014/0357105 A1* | 12/2014 | Wig | ...................... | H05K 1/0216 |
| | | | | 29/832 |
| 2016/0181712 A1* | 6/2016 | Wig | ...................... | H01R 12/737 |
| | | | | 29/842 |
| 2019/0393633 A1* | 12/2019 | Saito | ...................... | H01R 12/725 |
| 2022/0007508 A1* | 1/2022 | Stewart | ................... | H05K 1/117 |

* cited by examiner

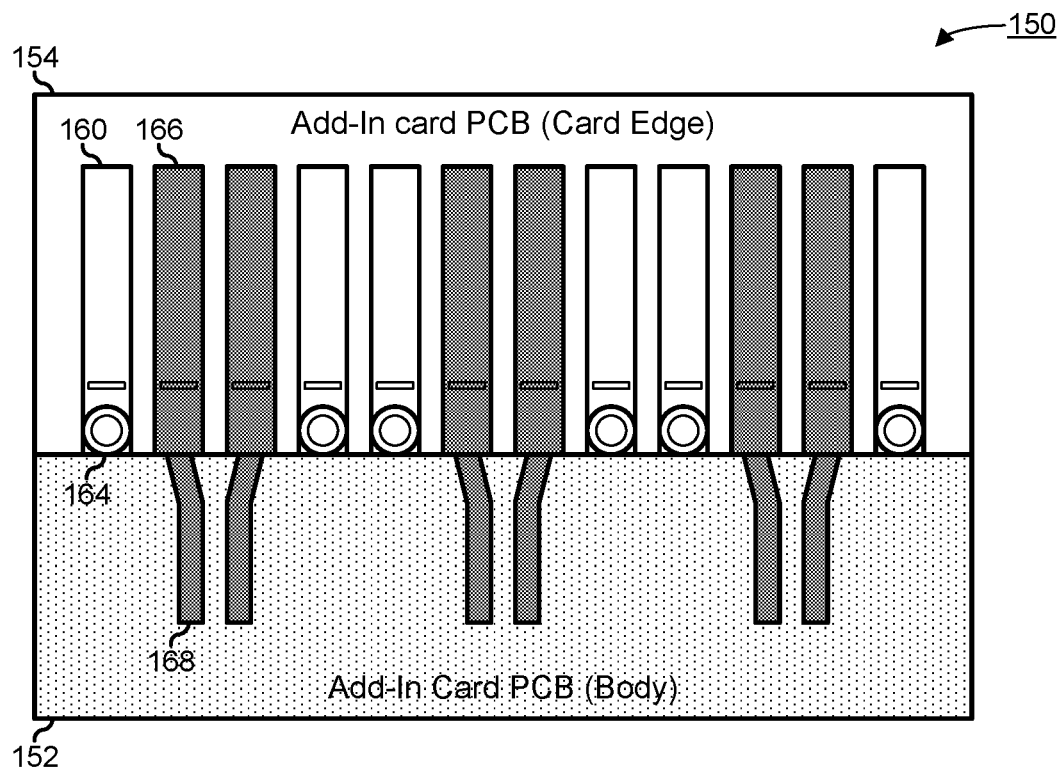
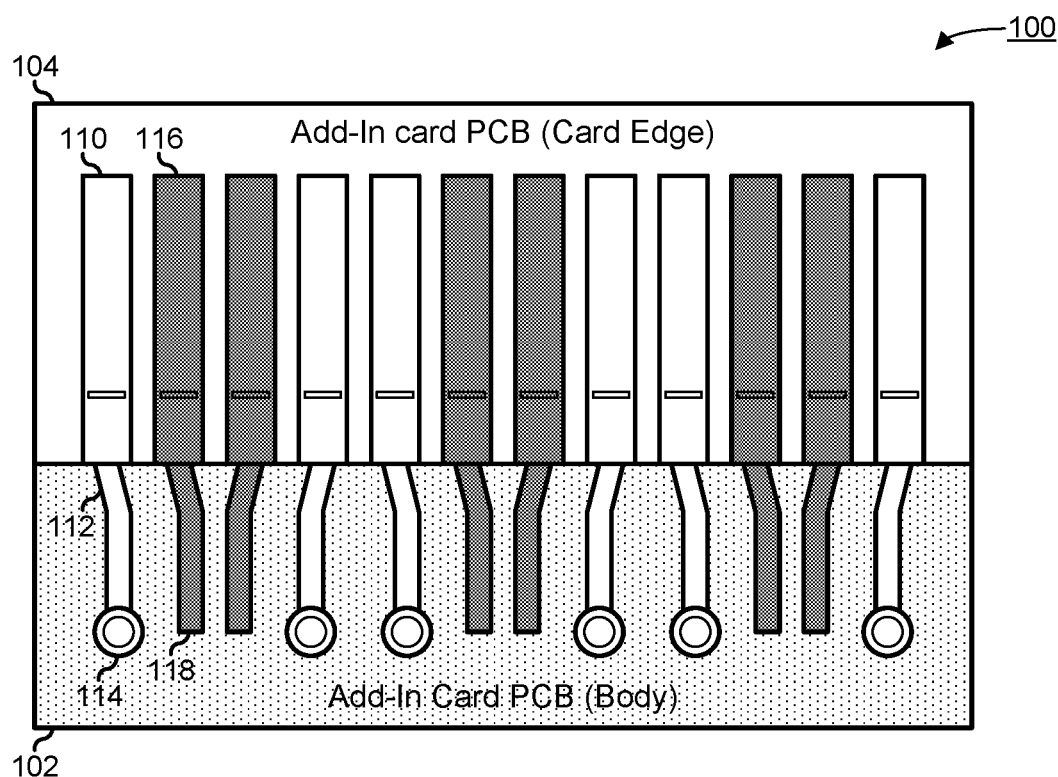
FIG. 1 *(Prior Art)*

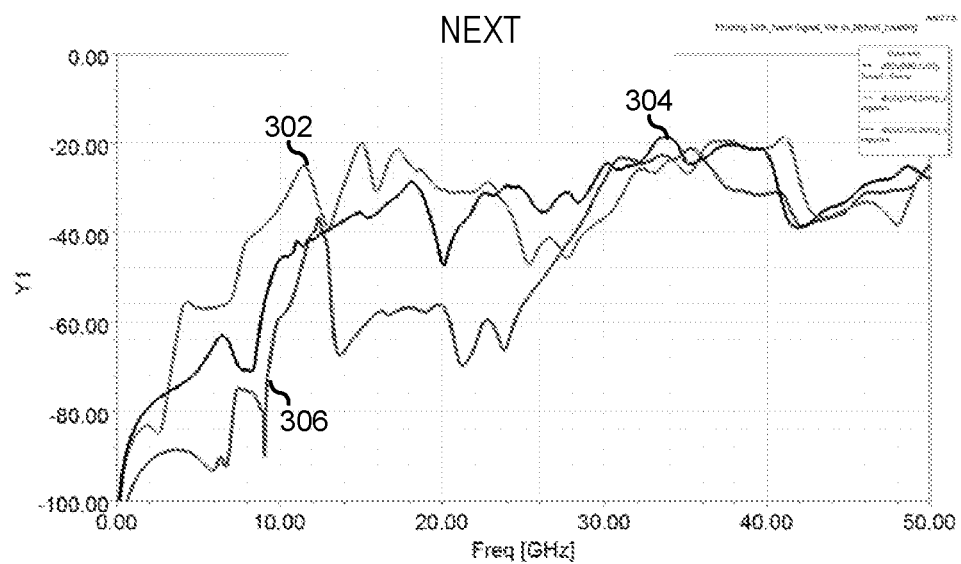
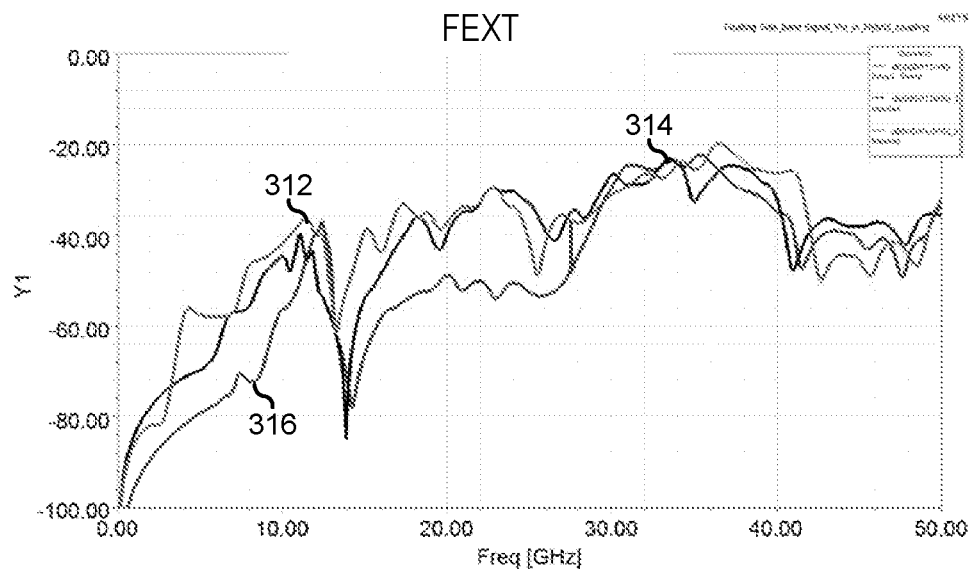
FIG. 3

ADD-IN CARD CONNECTOR EDGE FINGER OPTIMIZATION FOR HIGH-SPEED SIGNALING

FIELD OF THE DISCLOSURE

This disclosure generally relates to information handling systems, and more particularly relates to add-in card connector edge finger optimization for high-speed signaling in an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An add-in card printed circuit board (PCB) may include a body portion and a card edge portion. The body portion may include a circuit trace associated with a high-speed data communication interface. The card edge portion may include contact fingers, and may be configured to be inserted into a card edge connector of an information handling system. The contact fingers may include a signal contact finger coupled to the circuit trace, and a ground contact finger that is located adjacent to the signal contact finger. The ground contact finger may include a ground via that couples the ground contact finger to a ground plane layer of the add-in card PCB. The ground via may be located half way within the body portion and half way within the card edge portion.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which:

FIG. 1 illustrates an add-in card PCB according to the prior art;

FIG. 3 illustrates an example of circuit performance with add-in card PCBs in accordance with FIG. 1, as compared with the circuit performance with an add-in card PCB in accordance with FIG. 2.

The use of the same reference symbols in different drawings indicates similar or identical items.

DETAILED DESCRIPTION OF DRAWINGS

Figure 2:
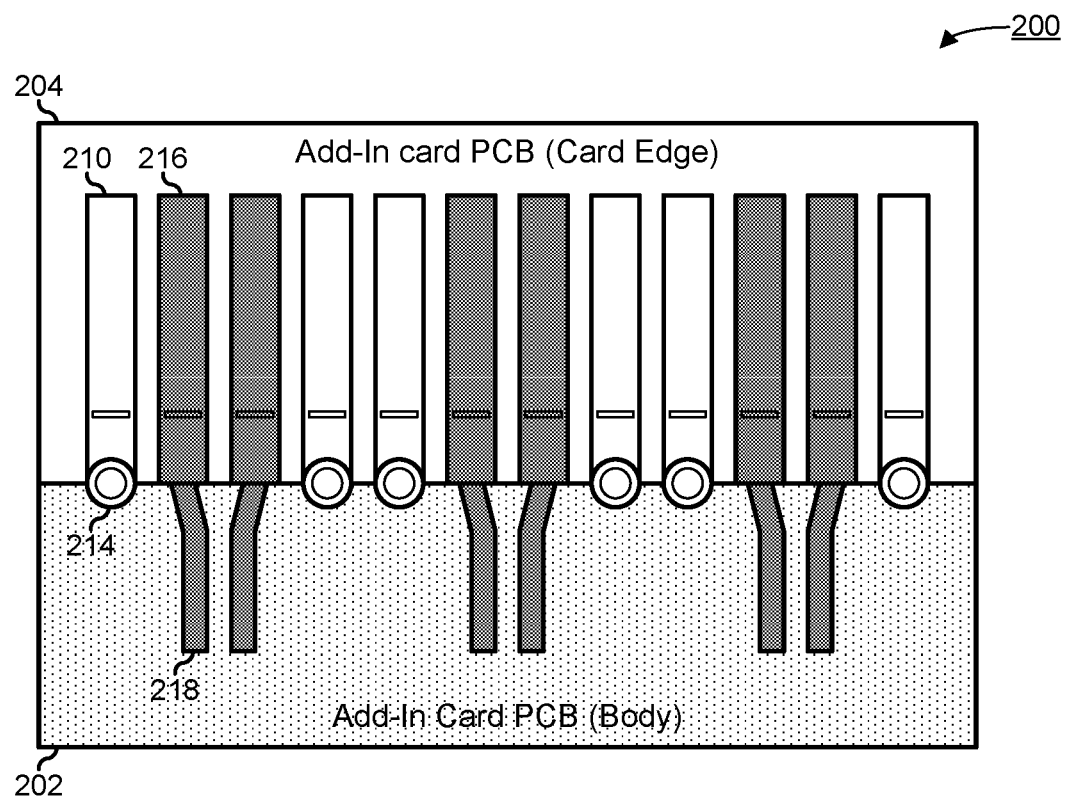
FIG. 2 illustrates an add-in card PCB according to an embodiment of the current disclosure.

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application.

The teachings can also be used in other applications, and with several different types of architectures, such as distributed computing architectures, client/server architectures, or middleware server architectures and associated resources.

FIG. 1 illustrates add-in card printed circuit boards (PCBs) 100 and 150 according to the prior art. Add-in card PCBs 100 and 150 represent electronic devices that are manufactured on a PCB to provide a desired function of the add-in card. Add-in card PCBs 100 and 150 are typically installed into expansion slots in an information handling system to provide additional functions and features beyond those available on the information handling system itself. As such, the information handling system will typically include complimentary edge connector sockets into which the edge connector portion of add-in card PCBs 100 and 150 may be inserted, and which are configured to mechanically retain and electrically connect the add-in card PCBs. An example of an add-in card PCB may include a PCI-Express (PCIe) add-in card such as a x4, x8, or x16 PCIe add-in card, an Accelerated Graphics Port (AGP) add-in card, a proprietary add-in card, or the like.

Add-in card PCB 100 includes a body portion 102 and a card edge portion 104. Body portion 102 provides circuit traces, and component pads and through-holes for mounting the components that provide the functions and features of add-in card PCB 100. As such, add-in card PCB 100 will be understood to be fabricated as a multi-layer PCB with various circuit traces formed on the front and back surfaces of the add-in card PCB, with various signal layers, power layers, and ground layers, and the like. The various circuit traces and layers may be formed of gold, nickel, tin, tin-lead, or other materials, as needed or desired. The circuit trace layers, ground layers, and power layers are sandwiched between insulating layers of PCB material which may include prepregnated fiberglass, Duroid, FR4, epoxy resin, or the like, as needed or desired. The circuit trace layers, ground layers, and power layers may include copper layers, aluminum layers, iron layers, or the like, as needed or desired. The details of PCB manufacture and add-in card assembly are known in the art, and will not be further described herein, except as needed to illustrate the current embodiments.

Card edge portion 104 makes up the edge connector portion that is complimentary to the edge connector socket on the information handling system, and includes ground connector fingers 110 and high-speed signal connector fingers 116. High-speed signal connector fingers 116 are each connected to the various components of body portion 102 via associated circuit traces 118. Circuit traces 118 will thus be understood to not terminate as illustrated, but to be connected to the various components as needed or desired. It is known that the use of a connector interface between an add-in card PCB edge connector and the complimentary edge connector socket on the information handling system may result in unwanted signal loss and reflections on the signal lanes instantiated on the connector, and to unwanted crosstalk between the various signal carrying lanes, particularly where the signal speeds are high, such as with PCIe signaling.

As such, typical add-in card PCB design rules provide for the inclusion of grounding structures surrounding the signal traces in the connector. Thus ground connector fingers 110 are connected by circuit traces 112 to ground vias 114 that couple ground connector fingers 110 to a ground plane in an interior layer of add-in card PCB 100 to reduce crosstalk between high-speed signal connector fingers 116. Ground vias 114 are located fully within body portion 102. It will be understood that, where the current view is a first, or top-side view, then a second, or bottom-side of add-in card PCB 100 may similarly include additional ground connector fingers and high-speed signal connector fingers, and that the ground connector fingers may be connected to a ground plane in the interior layer of the add-in card PCB as described above, as needed or desired. Where add-in card PCB 100 represents, for example, a PCIe add-in card, each high-speed signal connector finger 116 represents a connector finger for one half of a differential signal pair, and will thus be understood to be adjacent to a second high-speed signal connector finger similar to high-speed signal connector finger 116 for the other half of the differential signal pair, as illustrated, and each second high-speed signal connector finger will be adjacent to a second ground connector finger similar to ground connector finger 112.

Add-in card PCB 150 is similar to add-in card PCB 100 and includes a body portion 152 and a card edge portion 154. Body portion 152 provides circuit traces, and component pads and through-holes for mounting the components that provide the functions and features of add-in card PCB 150. Card edge portion 154 makes up the edge connector portion that is complimentary to the edge connector socket on the information handling system, and includes ground connector fingers 160 and high-speed signal connector fingers 166. High-speed signal connector fingers 166 are each connected to the various components of body portion 152 via associated circuit traces 168. Ground connector fingers 160 include ground vias 164 that couple the ground connector fingers to a ground plane in an interior layer of add-in card PCB 150 to reduce crosstalk between high-speed signal connector fingers 166.

Ground vias 164 are located fully within card edge portion 154. Where the current view is a first, or top-side view, then a second or bottom-side of add-in card PCB 150 may similarly include additional ground connector fingers and high-speed signal connector fingers, and the ground connector fingers may be connected to a ground plane in the interior layer of the add-in card PCB as described above, as needed or desired. Where add-in card PCB 100 represents, for example, a PCIe add-in card, each high-speed signal connector finger 166 represents a connector finger for one half of a differential signal pair, and will thus be understood to be adjacent to a second high-speed signal connector finger similar to high-speed signal connector finger 166 for the other half of the differential signal pair, as illustrated, and each second high-speed signal connector finger will be adjacent to a second ground connector finger similar to ground connector finger 160. The placement of ground vias 114 and 164 in respective add-in card PCBs 100 and 150 represent via placement designs for add-in card PCBs as are known in the art.

FIG. 2 illustrates an add-in card PCB 200 similar to add-in card PCBs 100 and 150. Add-in card PCB 200 includes a body portion 202 and a card edge portion 204. Body portion 202 provides circuit traces, and component pads and through-holes for mounting the components that provide the functions and features of add-in card PCB 200. As such, add-in card PCB 200 will be understood to be fabricated as a multi-layer PCB with various circuit traces (metal traces) formed on the front and back surfaces of the add-in card PCB, with various signal layers, power layers, and ground layers, and the like. The various circuit traces and layers may be formed of gold, nickel, tin, tin-lead, or other materials, as needed or desired.

Card edge portion 204 makes up the edge connector portion that is complimentary to the edge connector socket on the information handling system, and includes ground connector fingers 210 and high-speed signal connector fingers 216. High-speed signal connector fingers 216 are each connected to the various components of body portion 202 via associated circuit traces 218. Circuit traces 218 will thus be understood to not terminate as illustrated, but to be connected to the various components as needed or desired. Ground connector fingers 210 are connected to ground vias 214 that couple ground connector fingers 210 to a ground plane in an interior layer of add-in card PCB 200 to reduce crosstalk between high-speed signal connector fingers 216. Note here that ground vias 214 are not located fully within body portion 202, nor fully within card edge portion 204, but are located such that half of each ground via is located within the body portion and the other half of each ground via is located within the edge portion.

Where the current view is a first, or top-side view, then a second or bottom-side of add-in card PCB 200 may similarly include additional ground connector fingers and high-speed signal connector fingers, and the ground connector fingers may be connected to a ground plane in the interior layer of the add-in card PCB as described above, as needed or desired. Where add-in card PCB 100 represents, for example, a PCIe add-in card, each high-speed signal connector finger 216 represents a connector finger for one half of a differential signal pair, and will thus be understood to be adjacent to a second high-speed signal connector finger similar to high-speed signal connector finger 216 for the other half of the differential signal pair, as illustrated, and each second high-speed signal connector finger will be adjacent to a second ground connector finger similar to ground connector finger 210.

It has been understood by the inventors of the present disclosure that, when the ground vias are located fully outside of the ground connector fingers, as illustrated by add-in card PCB 100, then the crosstalk fields from the ground connector fingers may couple to the adjacent ground connector fingers. On the other hand, when the ground vias are located fully within the ground connector fingers, as illustrated by add-in card PCB 150, then the crosstalk between the ground connector fingers is reduced, but that the crosstalk coupling fields may still couple through the ground plane of the PCB. Here, by locating ground vias 214 half within body portion 202, and half within card edge portion 204, the crosstalk from both ground connector fingers 210 and from the ground plane are reduced. By way of illustration, FIG. 3 is illustrates experimental result for circuit traces as measured by Near End Crosstalk (NEXT) 300 and by Far End Crosstalk (FEXT) 310.

In the case of NEXT 300, a circuit trace with ground vias outside of the ground connector fingers, that is, fully within the body portion of the PCB is shown in trace 302, a circuit trace with ground vias inside the ground connector fingers, that is, fully within the card edge portion is shown in trace 304, and a circuit trace with ground vias that are half within the body portion and half within the card edge portion is shown in trace 306. Here, in the particular case of PCIe connections, where the operating frequency is around 8 GHz, it can readily be seen that the case with ground vias that are half within the body portion and half within the card edge portion, as shown in trace 306, provides better NEXT performance.

In the case of FEXT 310, a circuit trace with ground vias outside of the ground connector fingers, that is, fully within the body portion of the PCB is shown in trace 312, a circuit trace with ground vias inside the ground connector fingers, that is, fully within the card edge portion is shown in trace 314, and a circuit trace with ground vias that are half within the body portion and half within the card edge portion is shown in trace 316. Again, where the PCIe operating frequency is around 8 GHz, it can readily be seen that the case with ground vias that are half within the body portion and half within the card edge portion, as shown in trace 316, provides better FEXT performance.

Figure 4:
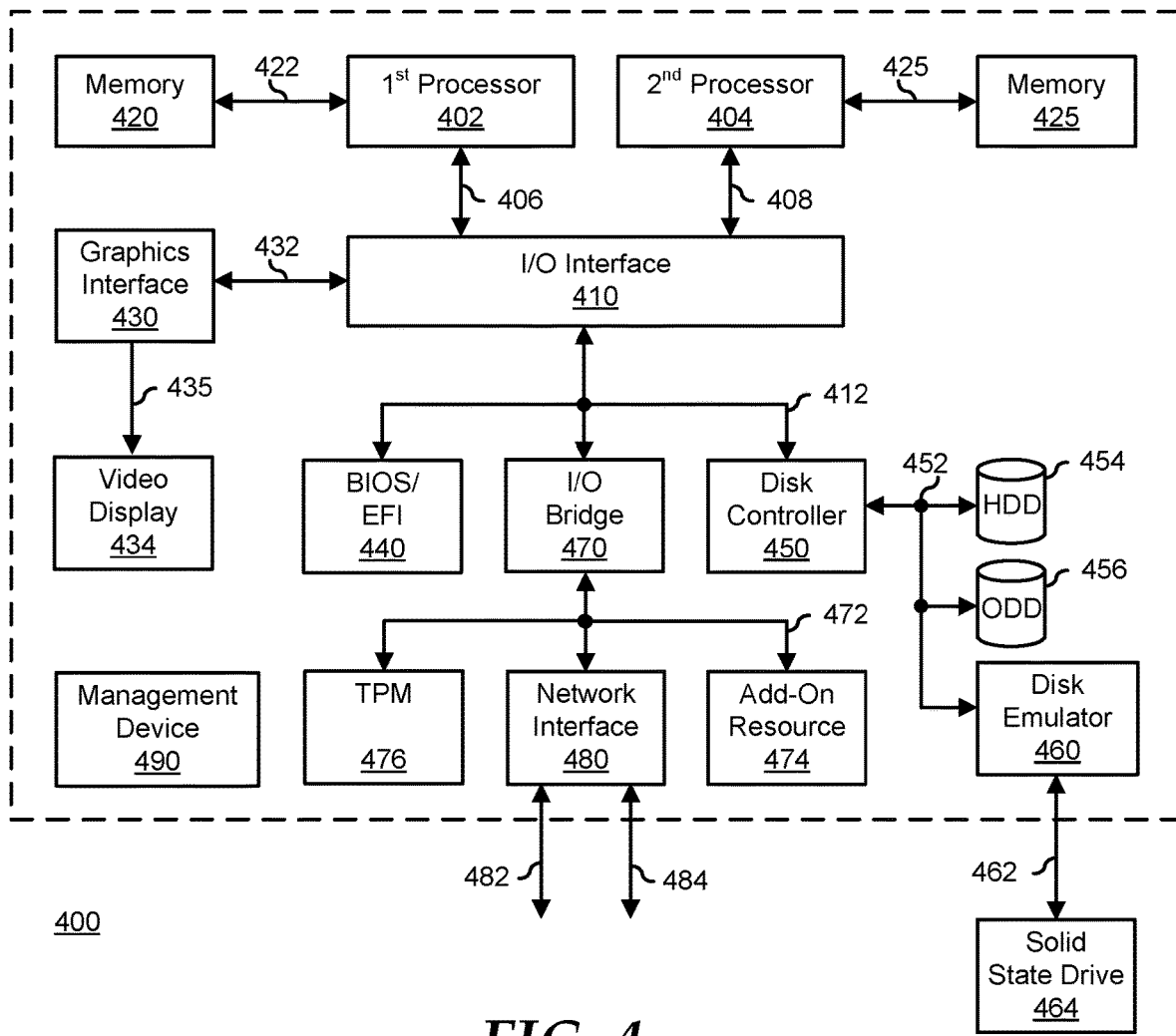
FIG. 4 is a block diagram illustrating a generalized information handling system according to another embodiment of the present disclosure.

FIG. 4 illustrates a generalized embodiment of an information handling system 400. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 400 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 400 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

Information handling system 400 can include devices or modules that embody one or more of the devices or modules described below, and operates to perform one or more of the methods described below. Information handling system 400 includes a processors 402 and 404, an input/output (I/O) interface 410, memories 420 and 425, a graphics interface 430, a basic input and output system/universal extensible firmware interface (BIOS/UEFI) module 440, a disk controller 450, a hard disk drive (HDD) 454, an optical disk drive (ODD) 456, a disk emulator 460 connected to an external solid state drive (SSD) 462, an I/O bridge 470, one or more add-on resources 474, a trusted platform module (TPM) 476, a network interface 480, and a management device 490. Processors 402 and 404, I/O interface 410, memory 420, graphics interface 430, BIOS/UEFI module 440, disk controller 450, HDD 454, ODD 456, disk emulator 460, SSD 462, I/O bridge 470, add-on resources 474, TPM 476, and network interface 480 operate together to provide a host environment of information handling system 400 that operates to provide the data processing functionality of the information handling system. The host environment operates to execute machine-executable code, including platform BIOS/UEFI code, device firmware, operating system code, applications, programs, and the like, to perform the data processing tasks associated with information handling system 400.

In the host environment, processor 402 is connected to I/O interface 410 via processor interface 406, and processor 404 is connected to the I/O interface via processor interface 408. Memory 420 is connected to processor 402 via a memory interface 422. Memory 425 is connected to processor 404 via a memory interface 427. Graphics interface 430 is connected to I/O interface 410 via a graphics interface 432, and provides a video display output 435 to a video display 434. In a particular embodiment, information handling system 400 includes separate memories that are dedicated to each of processors 402 and 404 via separate memory interfaces. An example of memories 420 and 425 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 440, disk controller 450, and I/O bridge 470 are connected to I/O interface 410 via an I/O channel 412. An example of I/O channel 412 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 410 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 440 includes BIOS/UEFI code operable to detect resources within information handling system 400, to provide drivers for the resources, initialize the resources, and access the resources. BIOS/UEFI module 440 includes code that operates to detect resources within information handling system 400, to provide drivers for the resources, to initialize the resources, and to access the resources.

Disk controller 450 includes a disk interface 452 that connects the disk controller to HDD 454, to ODD 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits SSD 464 to be connected to information handling system 400 via an external interface 462. An example of external interface 462 includes a USB interface, an IEEE 1394 (Firewire) interface, a proprietary interface, or a combination thereof. Alternatively, solid-state drive 464 can be disposed within information handling system 400.

I/O bridge 470 includes a peripheral interface 472 that connects the I/O bridge to add-on resource 474, to TPM 476, and to network interface 480. Peripheral interface 472 can be the same type of interface as I/O channel 412, or can be a different type of interface. As such, I/O bridge 470 extends the capacity of I/O channel 412 when peripheral interface 472 and the I/O channel are of the same type, and the I/O bridge translates information from a format suitable to the I/O channel to a format suitable to the peripheral channel 472 when they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof.

Network interface 480 represents a NIC disposed within information handling system 400, on a main circuit board of the information handling system, integrated onto another component such as I/O interface 410, in another suitable location, or a combination thereof. Network interface device 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

Management device 490 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 400. In particular, management device 490 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 400, such as system cooling fans and power supplies. Management device 490 can include a network connection to an external management system, and the management device can communicate with the management system to report status information for information handling system 400, to receive BIOS/UEFI or system firmware updates, or to perform other task for managing and controlling the operation of information handling system 400. Management device 490 can operate off of a separate power plane from the components of the host environment so that the management device receives power to manage information handling system 400 when the information handling system is otherwise shut down. An example of management device 490 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 490 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An add-in card printed circuit board (PCB), comprising:
    a body portion including a first circuit trace associated with a high-speed data communication interface; and
    a card edge portion including a plurality of contact fingers, the card edge configured to be inserted into a card edge connector of an information handling system, wherein the contact fingers include a first signal contact finger coupled to the first circuit trace and a first ground contact finger that is located adjacent to the first signal contact finger, wherein the first ground contact finger includes a first ground via that couples the first ground contact finger to a ground plane layer of the add-in card PCB, and wherein the first ground via is located half way within the body portion and half way within the card edge portion.

2. The add-in card PCB of claim 1, wherein:
    the body portion further includes a second circuit trace associated with the high-speed data communication interface;
    the contact fingers further include a second signal contact finger coupled to the second circuit trace and located adjacent to the first signal contact finger, and a second ground contact finger that is located adjacent to the second signal contact finger, wherein the second ground contact finger includes a second ground via that couples the second ground contact finger to the ground plane layer, and wherein the second ground via is located half way within the body portion and half way within the card edge portion.

3. The add-in card PCB of claim 2, wherein the first and second signal contact fingers comprise contact fingers for a differential signal pair of the high-speed data communication interface.

4. The add-in card PCB of claim 3, wherein the high-speed data communication interface is a PCIe interface.

5. The add-in card PCB of claim 1, wherein the ground contact finger is provided to decrease signal interference into the high-speed data communication interface.

6. The add-in card PCB of claim 5, wherein the signal interference includes crosstalk.

7. The add-in card PCB of claim 5, wherein the signal interference is decreased at an operating frequency of the high-speed data communication interface.

8. The add-in card PCB of claim 1, wherein the plurality of contact fingers comprise one of gold contact fingers, nickel contact fingers, tin contact fingers, and tin-lead contact fingers.

9. The add-in card PCB of claim 1, wherein the ground plane layer comprises one of a copper layer, an aluminum layer, and an iron layer.

10. The add-in card PCB of claim 1, wherein the ground plane layer is sandwiched between layers of dielectric material.

11. A method, comprising:
providing, on an add-in card printed circuit board (PCB), a body portion including a first circuit trace associated with a high-speed data communication interface;
providing, on the add-in card PCB, a card edge portion configured to be inserted into a card edge connector of an information handling system;
fabricating, on the card edge portion, a plurality of contact fingers including a first signal contact finger coupled to the first circuit trace, and a first ground contact finger that is located adjacent to the first signal contact finger; and
fabricating a first ground via that couples the first ground contact finger to a ground plane layer of the add-in card PCB, and wherein the first ground via is located substantially half way within the body portion and a remaining way within the card edge portion.

12. The method of claim 11, wherein:
the body portion further includes a second circuit trace associated with the high-speed data communication interface;
the contact fingers further include a second signal contact finger coupled to the second circuit trace and located adjacent to the first signal contact finger, and a second ground contact finger that is located adjacent to the second signal contact finger; and the method further comprises fabricating a second ground via that couples the second ground contact finger to the ground plane layer, wherein the second ground via is located half way within the body portion and half way within the card edge portion.

13. The method of claim 12, wherein the first and second signal contact fingers comprise contact fingers for a differential signal pair of the high-speed data communication interface.

14. The method of claim 13, wherein the high-speed data communication interface is a PCIe interface.

15. The method of claim 11, wherein the ground contact finger is provided to decrease signal interference into the high-speed data communication interface.

16. The method of claim 15, wherein the signal interference includes crosstalk.

17. The method of claim 15, wherein the signal interference is decreased at an operating frequency of the high-speed data communication interface.

18. The method of claim 11, wherein the plurality of contact fingers comprise one of gold contact fingers, nickel contact fingers, tin contact fingers, and tin-lead contact fingers.

19. The method of claim 11, wherein the ground plane layer comprises one of a copper layer, an aluminum layer, and an iron layer.

20. An add-in card for installation into an information handling system, the add-in card comprising:
a printed circuit board (PCB), including:
a body portion including a circuit trace associated with a high-speed data communication interface; and
a card edge portion including a plurality of contact fingers, the card edge configured to be inserted into a card edge connector of the information handling system, wherein the contact fingers include a signal contact finger coupled to the circuit trace and a ground contact finger that is located adjacent to the signal contact finger, wherein the ground contact finger includes a ground via that couples the ground contact finger to a ground plane layer of the PCB, and wherein the ground via is located half way within the body portion and half way within the card edge portion; and
a component coupled to the circuit trace.

* * * * *